United States Patent
Thevenot et al.

(10) Patent No.: US 6,301,119 B1
(45) Date of Patent: Oct. 9, 2001

(54) INTEGRATED CIRCUIT CARD WITH TWO CONNECTION MODES

(75) Inventors: Benoît Thevenot, Olivet; Pascal Billebaud, Orleans; Thierry Bitschnau, Senlis; Christophe Fletout, Boigny sur Bionne, all of (FR)

(73) Assignee: Schlumberger Systemes, Montrouge (FR)

( * ) Notice: Subject to any disclaimer, the term of this patent is extended or adjusted under 35 U.S.C. 154(b) by 0 days.

(21) Appl. No.: 09/230,718

(22) PCT Filed: Jul. 31, 1997

(86) PCT No.: PCT/FR97/01434

§ 371 Date: Jul. 13, 1999

§ 102(e) Date: Jul. 13, 1999

(87) PCT Pub. No.: WO98/06063

PCT Pub. Date: Feb. 12, 1998

(30) Foreign Application Priority Data

Aug. 2, 1996 (FR) .................................................. 96 09802
Sep. 20, 1996 (FR) .................................................. 96 11488

(51) Int. Cl.⁷ ..................................................... H05K 1/14
(52) U.S. Cl. ........................... 361/737; 361/736; 361/761; 361/764; 174/260; 257/679; 257/698; 438/640
(58) Field of Search .................................... 361/736, 737, 361/761, 764, 782, 783; 257/674, 698, 679, 774; 235/488, 491, 492; 174/260–264, 773, 774; 438/640; 216/18, 19

(56) References Cited

U.S. PATENT DOCUMENTS

| | | | |
|---|---|---|---|
| 5,027,190 | * | 6/1991 | Haghiri-Tehrani et al. ........... 357/74 |
| 5,519,201 | * | 5/1996 | Templeton, Jr. et al. ............. 235/492 |
| 5,542,175 | * | 8/1996 | Bhatt et al. .............................. 29/846 |
| 5,578,796 | * | 11/1996 | Bhatt et al. ........................... 174/260 |
| 5,598,032 | * | 1/1997 | Fidalgo ................................ 257/679 |
| 5,889,655 | * | 3/1999 | Barrow ................................. 361/760 |
| 5,999,415 | * | 12/1999 | Hamzehdoost ....................... 361/803 |
| 6,008,993 | * | 12/1999 | Kreft .................................... 361/737 |
| 6,025,995 | * | 2/2000 | Marcinkiewicz .................... 361/760 |
| 6,028,774 | * | 2/2000 | Shin et al. ............................ 361/764 |
| 6,052,287 | * | 4/2000 | Palmer et al. ....................... 361/767 |
| 6,115,255 | * | 9/2000 | Iovdalsky ............................ 361/705 |

FOREIGN PATENT DOCUMENTS

| | | |
|---|---|---|
| 4403753 | 7/1995 | (DE) . |
| 19505245 | 4/1996 | (DE) . |
| 19500925 | 7/1996 | (DE) . |
| 0682321 | 11/1995 | (EP) . |
| 2726106 | 4/1996 | (FR) . |
| 9705569 | 2/1997 | (WO) . |

* cited by examiner

*Primary Examiner*—Jeffrey Gaffin
*Assistant Examiner*—Tuan Dinh

(57) ABSTRACT

An integrated circuit card with two connection modes. The integrated circuit card includes a card body in which there is embedded a link circuit for linking a contactless coupling element (1) to a module having an integrated circuit (6) connected to conductive areas carried by a support film (4). The link circuit extends in register with conductive areas (18) dedicated to making a contactless link and is connected to said conductive areas by an electrically conductive material (32, 36, 42) filling blind holes (31, 35, 41). The blind holes have sections that increase from a bottom of each hole towards an opening thereof over at least a portion of their height.

9 Claims, 4 Drawing Sheets

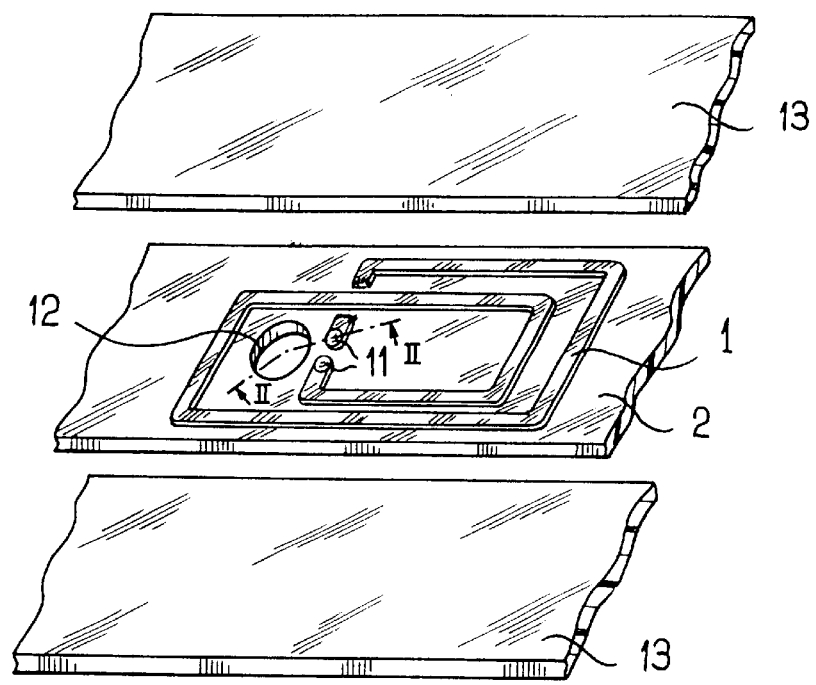
FIG_1
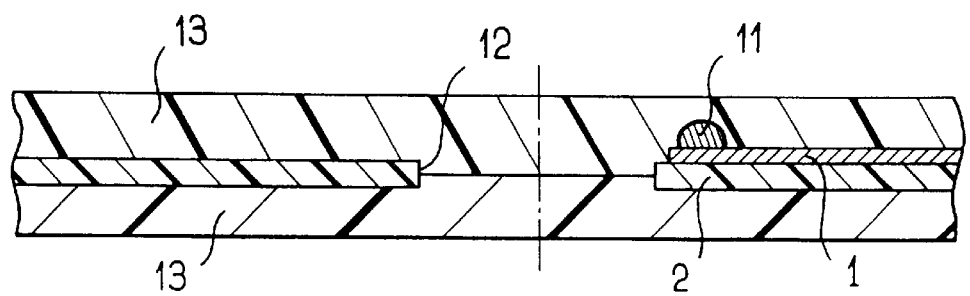
FIG_2
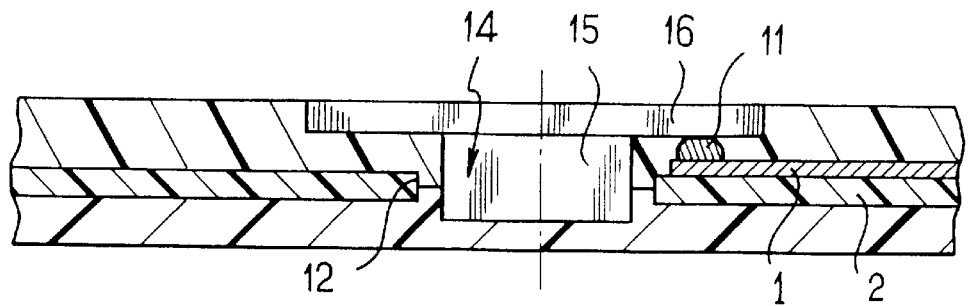
FIG_3

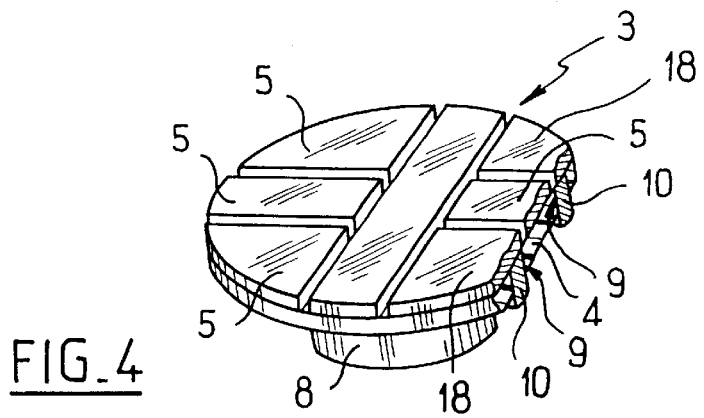
FIG_4
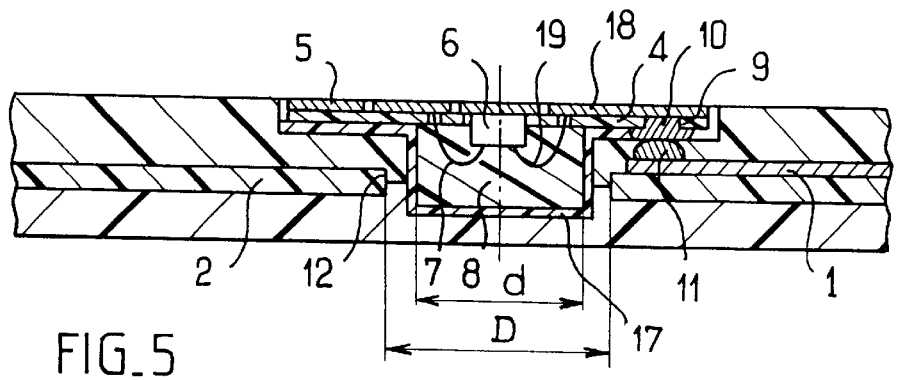
FIG_5
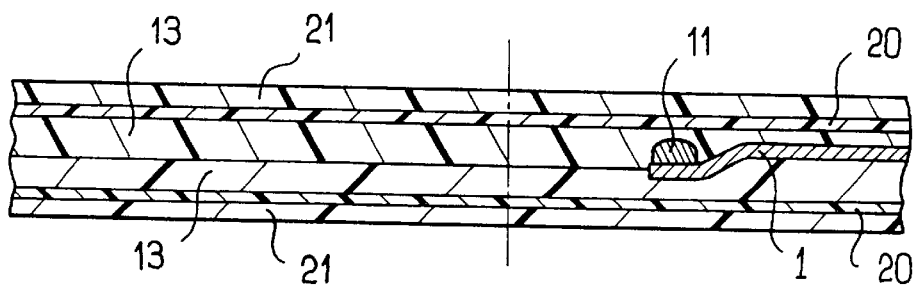
FIG_6
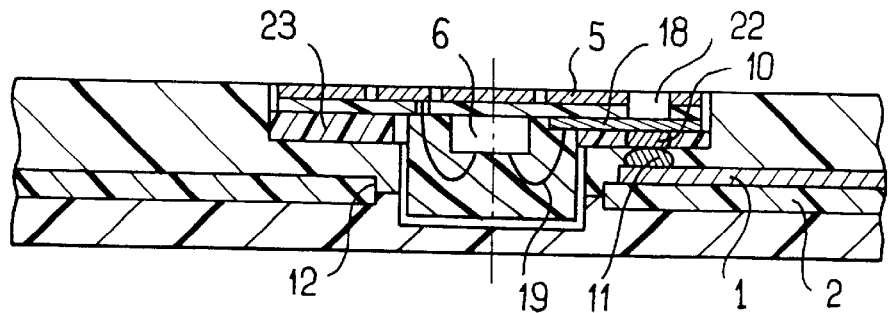
FIG_7

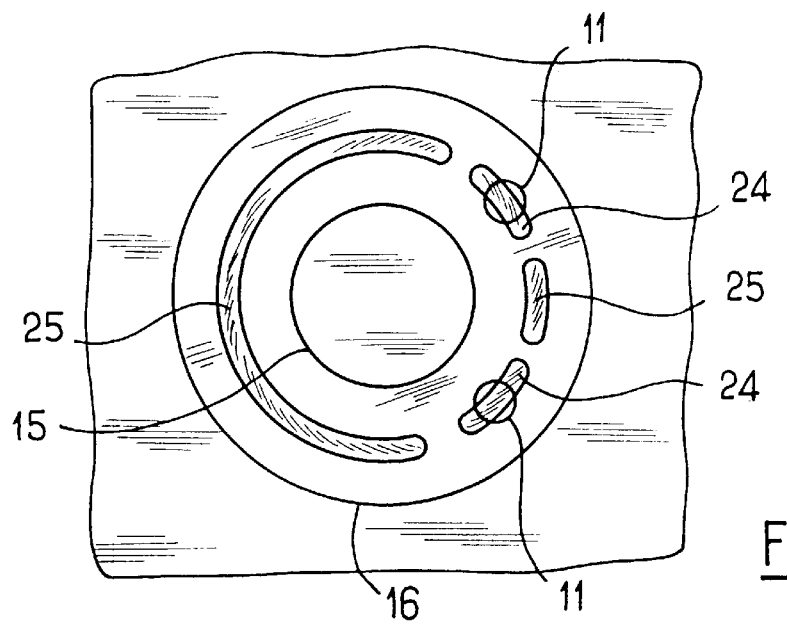
FIG_8
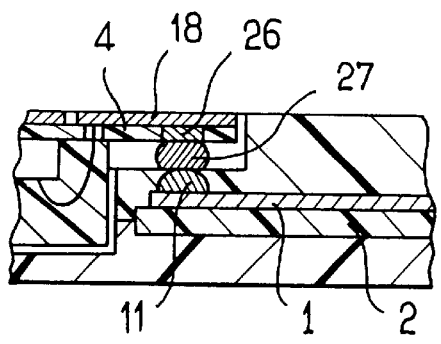
FIG_9
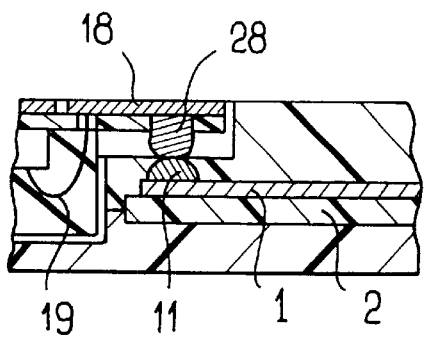
FIG_10
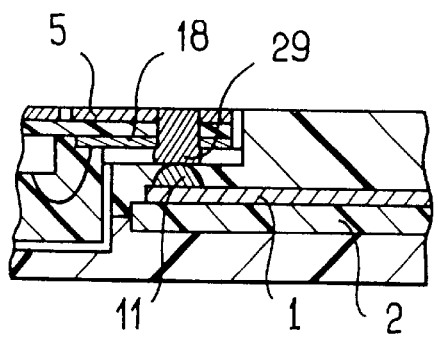
FIG_11
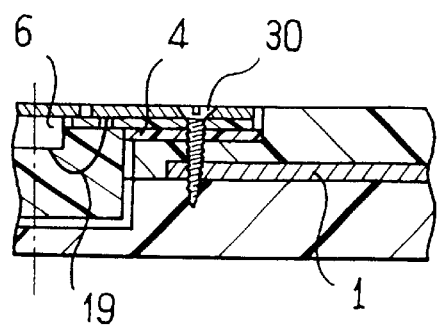
FIG_12

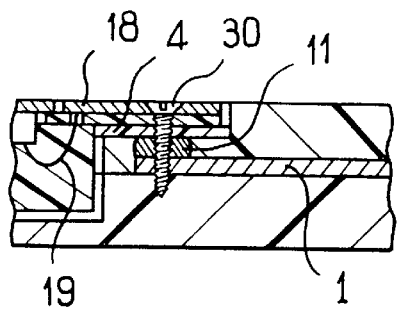
FIG_13
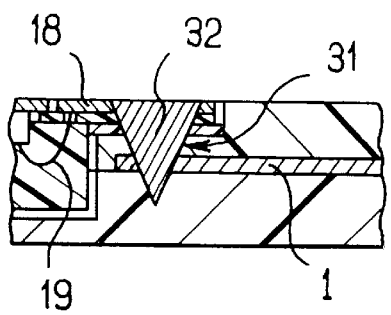
FIG_14
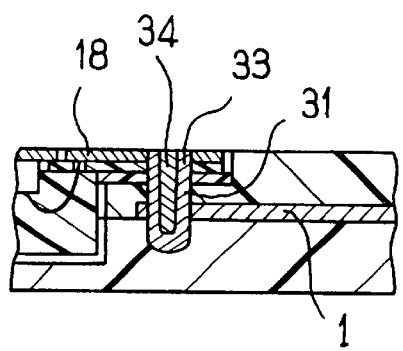
FIG_15
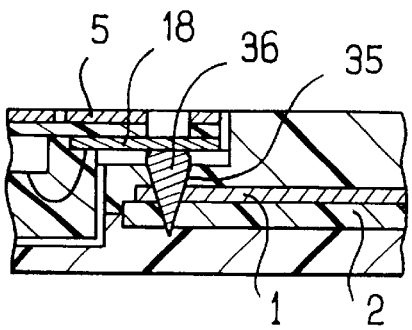
FIG_16
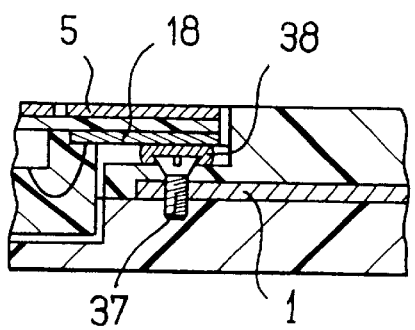
FIG_17
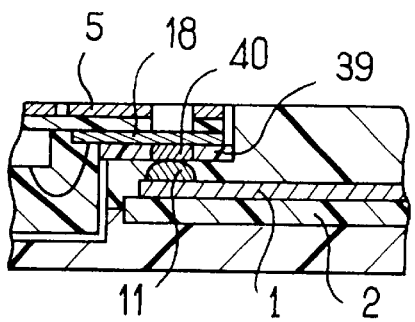
FIG_18
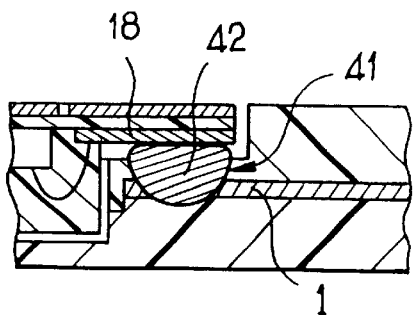
FIG_19

INTEGRATED CIRCUIT CARD WITH TWO CONNECTION MODES

BACKGROUND OF THE INVENTION

The present invention relates to an integrated circuit card having two connection modes.

A card with two connection modes means a card capable of being connected to a device either via a link involving contact, i.e. a metallic link via contact areas flush with the outside surface of the card, or else via a contactless link. For the contactless link, the card includes a contactless coupling element such as an induction loop, a radio antenna, or an optical coupling member connected via a link circuit embedded in the card to an interface that is generally contained in the integrated circuit.

Document EP 682 321 discloses an integrated circuit card having two connection modes comprising a card body in which there is embedded an antenna connected to a module comprising an integrated circuit connected to conductive areas carried by a support film, the antenna having ends in register with the conductive areas. That document provides for the conductive areas of the module to be put directly into contact with the ends of the antenna. That poses a problem, since module positioning must be extremely accurate, and is therefore incompatible with manufacturing at a high rate of throughput.

OBJECT AND SUMMARY OF THE INVENTION

The present invention relates to various embodiments making it possible at low cost and at a high throughput rate to provide links between the link circuit of a contactless coupling element and a module comprising an integrated circuit connected to conductive areas carried by a support film.

BRIEF DESCRIPTION OF THE DRAWINGS

The characteristics and advantages of the invention appear on reading the following description of numerous particular and non-limiting embodiments of the invention all relating to the same inventive idea, and given with reference to the accompanying figures, in which:

FIG. 1 is an exploded perspective view of the sheets constituting the body of the card in an embodiment of the invention;

FIG. 2 is a fragmentary section view on a larger scale on line II—II of FIG. 1 during an intermediate step in making a first embodiment of a card of the invention;

FIG. 3 is a section view analogous to that of FIG. 2, in a later step;

FIG. 4 is a partially cutaway perspective view of an integrated circuit module corresponding to the first embodiment of the invention;

FIG. 5 is a section view analogous to that of FIG. 2, after the integrated circuit module has been put into place;

FIG. 6 shows a variant associated with the first embodiment; and

FIGS. 7 to 19 are fragmentary section views of various other embodiments of the invention.

MORE DETAILED DESCRIPTION

With reference to FIGS. 1 to 6, in the first embodiment, the integrated circuit card of the invention with two connection modes is made from a contactless coupling element in the form of an antenna 1 carried by a support sheet 2, and a module given general reference 3 (see FIGS. 4 and 5) comprising a support film 4 fitted with conductive areas 5 connected to an integrated circuit 6 by wires 7 to provide links by contact, and conductive areas 18 connected to the integrated circuit 6 by wires 19 to provide links with a contactless interface included in the integrated circuit 6. The integrated circuit 6 and the link wires 7 and 19 are embedded in a block of resin 8.

The antenna 1 has two ends adjacent to each other forming a link circuit for linking the contactless coupling element as constituted by the antenna with the conductive areas 18 of the module. For an optical coupling element, this link circuit would be constituted by conductive tracks extending in analogous manner on a support sheet. By way of example, the link circuit would be constituted by copper tracks made using conventional printed circuit techniques.

In this first embodiment of the invention, link pads 11 are formed on the ends of the antenna and project from the ends of the antenna (see FIG. 2). The link pads 11 may be made by silkscreen printing a conductive polymer or by mechanically depositing a drop of metal. They may also be made in the form of electrolytic deposits, or by using adhesive (a conductive adhesive), or by soldering a metal pad on the link printed circuit, or indeed by chemical etching or mechanically machining a thick track.

In this embodiment, the conductive areas 18 are carried by the outside face of the module 3. The support film 4 of the integrated circuit module 3 has holes 9 facing the contact areas 18 and provided with connection pads 10, e.g. made of a conductive material comprising a polymer containing conductive grains, and projecting from a face of the support film 4 facing away from the contact areas 18. For connection pads 10 made of conductive material, the material is preferably in a plastic state prior to the module being incorporated in the integrated circuit card of the invention.

In order to make it possible to provide links between the conductive areas 18 of the module and the ends of the antenna 1, the holes 9 in the support film of the module are made in a disposition that enables them to be put into register with the link pads 11 when the integrated circuit module 3 is implanted in the card.

In the embodiment shown, the support sheet 2 for the antenna 1 is made out of a reinforced synthetic material, e.g. an epoxy resin reinforced by glass fibers or polyester fibers, and the antenna 1 is made in the form of a printed circuit on the support sheet 2. In this embodiment, the support sheet 2 has an opening 12 of transverse dimension D greater than the transverse dimension d of the resin block 8 containing the integrated circuit 6 (FIG. 5).

To make the card of the invention as shown in FIG. 5, the support sheet 2 for the antenna 1 is initially covered on both faces with sheets of insulating material 13. Sheets of thermoplastic material such as PVC are, for example, pressed against the support sheet 2 by hot-rolling so that the sheets of insulating material 13 adhere to the support sheet 2 and flow so as to fill the opening 12 through the support sheet 2 in uniform manner. The material filling the opening 12 also serves to embed the support sheet 2 in the mass of thermoplastic material formed by softening the sheets 13. A sandwich structure is thus obtained as shown in section in FIG. 2.

A cavity given general reference 14 is then dug out in the card body formed in this way (FIG. 3). The cavity 14 has a central portion 15 of relatively small diameter and large depth for receiving the resin block 8 of the module 3, and a peripheral portion 6 of larger diameter and shallower depth for receiving the support film 4 and the conductive areas 5 of the module 3. In this respect, it will be observed that the height of the link pads 11 is designed so that when the portion 16 of the cavity is made, the antenna link pads 11 extend into the bottom of the cavity. By making link pads that project from the ends of the antenna, it is possible to machine the cavity with ordinary tolerances without running the risk of damaging the antenna. In this context, it should be observed that given the accuracy with which the link circuit is positioned on the support sheet and given the tolerances with which the cavity is made, it turns out at present that an extra thickness of only 70 micrometers suffices.

It should also be observed that making an opening 12 in the support sheet 2 of transverse dimension greater than the transverse dimension of the resin block of the module 3 makes it possible to form the cavity in a mass of uniform material, thereby making it possible to use a tool that is specifically adapted to said material. Furthermore, the uniform thermoplastic material surrounding the portion 15 of the cavity serves to embed the edge of the opening 12 through the support sheet 2, thereby providing the card with better strength against the forces to which it is subjected during various operations, whether during manufacture or in use. The sheets 13 are preferably of thicknesses that are determined so that after rolling, the antenna 1 lies in the vicinity of the neutral fiber of the card. This avoids the card body bending phenomena that result from differential expansion when the antenna 1 is not on the neutral fiber. The antenna 1 or the link circuit of the contactless coupling element can also be made directly on a sheet of thermoplastic material. In this context, it should nevertheless be observed that during rolling, the pads 11 constitute non-uniform masses which tend to be shifted towards the center of the card as shown in FIG. 6 under the effect of the pressure applied to the plastics material while it is flowing. This deformation causes the thermoplastic material to flow to a greater extent in register with the pads 11. This distorts the decoration which is generally printed on the outside faces of the sheets 13. To avoid such deformation, it is therefore advantageous to provide intermediate sheets 20 carrying decoration and having a softening temperature which is higher than that of the rolling temperature. The intermediate sheets 20 are coated in an adhesive that is activatable by applying heat and may preferably be covered in transparent protective sheets 21.

After the cavity has been made, the module 3 is implanted in the card, e.g. by placing a small quantity of adhesive 17 in the bottom of the cavity, which adhesive spreads out in the gap between the block of resin 8 and the wall of the cavity 14. While the module 3 is being put into place in the card body, the conductive material 10 placed in the holes 9 of the support film 4 is compressed as shown in FIG. 5 and provides contact with the link pads 11, thus forming conductive members between the conductive areas 18 and the antenna 1. As shown in FIG. 5, the compressed connection pads 10 project laterally from the holes 9 so as to provide sufficient contact with the pads 11 even if they are not exactly in register therewith when the module is put into place. When the conductive material 10 is in a plastic state prior to the module being put into place, it is preferable, once the module is in place, to provide for the conductive material to harden with temperature so as to ensure greater reliability of the connection. In this context, it should be observed that in this embodiment the conductive areas 18 which are connected to the ends of the antenna, even though they face towards the outside of the module, i.e. away from the integrated circuit 6, need not be used for making contact with a machine. Under such circumstances, the conductive areas 18 which are connected to the antenna are used only for providing a bridge between the ends of the antenna and the corresponding wires 19.

FIG. 7 shows a second embodiment in which the conductive areas 18 serving to provide a bridge between the integrated circuit 6 and the ends of the antenna are disposed this time on the same face of the support film 4 as carries the integrated circuit 6.

In this case, the module preferably has holes 22 in register with the conductive areas 18, which holes enable a heating tool to be put into contact with the conductive areas 18 when the module is put into place. The connection pads 10 and the link pads 11 which serve to connect the conductive areas 18 to the ends of the antenna 1 are then advantageously made of a meltable conductive material, e.g. a conductive material including metal grains having different melting point& as described in document FR-A-2 726 001, thereby making it possible to provide bonding at high temperature and to obtain a link of particularly low electrical resistance between the conductive areas and the antenna.

Also, in this embodiment, the module is fixed by an elongate bead of adhesive 23 disposed in the bottom of the portion 16 of the cavity 14, which bead is interrupted in register with the link pads 11.

This connection can also be made by depositing a drop of conductive polymer on the end of the pad 11 that is visible in the bottom of the cavity prior to the module being fixed in the cavity. In which case the conductive area 18 is not provided with a connection pad 10. In both cases and for the purpose of defining the location of the adhesive and the location of the conductive material, it is preferable to form grooves in the bottom of the portion 16 of the cavity as shown in FIG. 6 which is a plan view of the cavity prior to the module being put into place. Grooves 24 are provided to extend across the ends of the pads 11, and grooves 25 are formed on either side of the grooves 24. The depths of the grooves 24 and 25 are adapted to the kinds of substances used so that the facing surfaces are appropriately wetted by the corresponding substances when the module is put into place. In particular, when the conductive material is fixed on the contact areas of the module, it is important for the grooves 24 to be deeper than the grooves 25 so that the conductive material does not constitute an obstacle to making contact with the portions of the module facing the adhesive.

FIG. 9, which is a fragmentary section view of the card through the link between the module and the link circuit of the contactless coupling element, shows a variant of this embodiment. In this variant, the conductive area 18 is carried by the outside face of the support film 4 which then has holes in register with the pads 11. A conductive pad 26, which may be rigid or of thermoplastic material, is fixed in each hole of the film and is surfaced so that its bottom face is flush with the bottom surface of the film. The link between the pad 26 and the pad 11 is provided by a drop of thermoplastic material 27.

In the embodiment of FIG. 5, as in the embodiment of FIG. 7, it is also possible to provide a lug 10 of rigid conductive material which is heated while the module is being put into place and which then penetrates into a link pad 11 of hot-melt conductive material.

FIG. 10 shows another variant in which the link between the conductive area 18 and the pad 11 is provided by a conductive elastic insert 28, e.g. an insert made of an elastomer that has been made conductive in its bulk or that has been covered in a conductive coating or a conductive powder.

FIG. 11 shows another variant embodiment in which the support film 4 and the conductive area 18 are pierced by a hole which opens out to the outside surface of the module. A drop of hot-melt conductive polymer or a conductive elastic insert 29 is placed on the pad 11 prior to the module being put into place. After the module has been put into place, this disposition makes it possible to level off the conductive material which projects from the hole to the outside of the module. It is also possible to insert conductive material (in solid or semi-solid form) into the hole after the module has been mounted on the card.

For the contact areas 5 and 18 in register with each other as shown in FIG. 11, it is nevertheless appropriate to insulate the edge of the hole in the contact area 5 or to use a conductive element that does not reach the contact area 5 or that includes an insulating portion facing the contact area 5 so as to avoid making a short circuit between the conductive areas 5 and 18.

FIG. 12 shows a third embodiment in which the antenna 1 is no longer carried by an epoxy resin support sheet sandwiched between two thermoplastic sheets, but is made directly on a thermoplastic sheet which it then suffices to cover on its antenna-carrying face with another sheet of the same kind so as to obtain a card body of uniform material.

In addition, in this third embodiment, the links between the conductive pads 18 and the antenna 1 are provided by rigid conductive members, in this case screws 30 which pass through the conductive areas 18 and the corresponding ends of the antenna 1. In this case, the conductive member is put into place after the module has been fixed in the cavity of the card.

FIG. 13 shows a variant embodiment in which this embodiment of the links by means of rigid members passing through the layers to be connected together is used in association with an antenna 1 that is fitted with a connection pad 11 projecting from the antenna. This increases the contact area between the screw 30 and the end of the antenna forming the antenna link circuit.

FIG. 14 shows another embodiment in which a conductive member is inserted in a hole that opens out in the surface of the card and that passes through the antenna without the antenna being previously fitted with a connection pad 11.

In this embodiment, the module is put into place before a link is made, as in the cases of FIGS. 12 and 13, and then respective holes 31 are made through the portions of the module and of the card that overlie the ends of the antenna, and through said ends, i.e. the holes 31 pass through the link circuit and the associated conductive areas 18. The holes made in this way are filled with conductive material which can be either in the form of a rigid insert of complementary shape engaged by force or held by a helical thread, or a conductive material inserted in the semi-solid state, or rigid inserts in association with semisolid material, or indeed a conductive elastic material. In the embodiment of FIG. 14 the blind hole 31 is conical. This shape has the advantage of increasing the contact area between the conductive link members and the conductive areas through which they pass. In particular, given the very small thicknesses of the various layers passed through, it is possible industrially to make a conical hole having an angle at the apex of 120°, thereby doubling the area of contact with the layers passed through.

In addition, a conical hole makes it possible visually to inspect the quality of the hole formed using a simple camera in order to make sure, in particular, that no swarf is present and in order to verify the surface state of the conductive layers passed through.

In addition, a conical hole, or more generally a blind hole of section that increases from the bottom end of the hole to its open end, is easier to fill than a cylindrical hole and provides automatic centering of the inserted conductive material, whether it is rigid or semi-solid, thus making it possible to increase positioning tolerance for the tools used for putting the conductive material into place.

In order to mask the conductive material, it is it possible to cover it with a metal land or with an ink of color analogous to that of the surface of the card at the location where the hole opens out to the surface thereof.

When the conductive material is semi-solid, it is possible to use a material that is naturally conductive in the semi-solid state or a material that is caused to become conductive by heating or after curing.

FIG. 15 shows a variant of this type of link. In this variant embodiment, the blind hole 31 is cylindrical and the conductive material filling the hole is an association of a conductive material 33 inserted in the semi-solid state, plus a rigid insert 34 inserted into the semi-solid material. This solution combines the advantages of the low resistivity of the rigid insert with the good contact made by the semi-solid material with all of the exposed surfaces. In this context, it is advantageous to use the conductive ink described in above-mentioned document FR-A-2 726 001 together with a heated insert which serves to melt the metal grains of lower melting point and which simultaneously compensates for the reduction in volume that results from such melting.

FIG. 16 shows yet another type of link consisting in making a blind hole 35 in the card body and through the end of the antenna 1 after the cavity 14 has been made but before the module is mounted, and then in inserting a conductive link member in the hole. In the embodiment of FIG. 16, the blind hole 35 is conical and the link member is in the form of a block of material that was inserted in the semi-solid state and then cured, and that projects slightly from the bottom of the cavity over a thickness substantially equal to the thickness of the adhesive serving to fix the module in the cavity (the thickness of the projection can be controlled by machining). While the module is being mounted, the blind hole 31 is thus put simultaneously into contact with the conductive area 18 of the module. It is also possible to press a hot punch over the pad 36 so as to finish off its connection with the conductive area 18. It is also possible to make this type of link by pawing an elastic conductive member in the hole 35.

FIG. 17 shows a variant of this embodiment which consists in fixing a rigid insert, in this case a screw 37, in the bottom of the cavity 14 so that the insert 37 passes through the end of the antenna 1 and extends so as to project slightly from the bottom of the cavity, with the projecting portion then being covered in conductive material 38 so as to provide good contact with the conductive area 18.

FIG. 18 shows an embodiment using an anisotropic adhesive 39 for fixing the module in a cavity into which there extends a link pad 11 associated with one end of the antenna, and then in subjecting the adhesive to localized pressure in register with the link pad 11 so as to make the corresponding portion 40 of the adhesive 39 conductive. Thus while nevertheless using a continuous elongate bead of anisotropic adhesive or a washer of anisotropic adhesive to provide uniform fixing for the module, it is still possible to obtain localized conduction in this way.

FIG. 19 shows an embodiment in which the blind hole 41 passing through the body of the card and the end of the link circuit is in the form of a spherical cap, or more generally of concave curvilinear section (which could be in the form of a paraboloid or an ellipsoid). This shape defines a larger volume than does a conical hole, thereby making it possible to increase tolerance on the volume of the drop of conductive material 42 which is inserted into the hole, while nevertheless conserving a satisfactory link between the link circuit and the associated conductive area 18.

Naturally, the invention is not limited to the embodiments described and variants can be made thereto without going beyond the ambit of the invention, as defined by the claims.

In particular, the various embodiments of the card body and of the module can be combined in assemblies other than those shown.

The support sheet 2 and the covering sheets 13 are preferably made in the form of continuous strips, possibly provided with lateral perforations (not shown) so as to make a series of cards by sequentially displacing the strips through successive workstations.

What is claimed is:

1. An integrated circuit card with two connection modes, including a contact mode by contact areas (5) flush with an outside surface of the card and a contactless mode using a contactless coupling element (1), said integrated circuit card comprising a card body in which there is embedded a link circuit for linking a contactless coupling element (1) to a module comprising an integrated circuit (6) connected to conductive areas carried by a support film (4), the link circuit extending in register with conductive areas (18) dedicated to making a contactless link and being connected to said conductive areas by an electrically conductive material (32, 36, 42) filling blind holes (31, 35, 41) of section that increases from a bottom of each hole towards an opening thereof over at least a portion of their height.

2. A card according to claim 1, wherein the holes pass through the link circuit.

3. A card according to claim 1, wherein the holes are conical.

4. A card according to claim 3, wherein the conical holes have an angle at the apex of 120°.

5. A card according to claim 1, wherein the conductive material (36, 42) projects relative to the holes (35, 41).

6. A card according to claim 1, wherein the holes are of a concave curvilinear shape.

7. A card according to claim 6, wherein the holes are hemispherical.

8. A card according to claim 1, wherein the holes (31) extend through the support film.

9. A card according to claim 1, wherein the support film includes blind holes (22) in register with the dedicated conductive areas and opening out in a face of the module facing away from the integrated circuit.

* * * * *